United States Patent
Hsu et al.

(10) Patent No.: US 9,373,526 B2
(45) Date of Patent: Jun. 21, 2016

(54) CHIP PACKAGE AND METHOD FOR FORMING THE SAME

(71) Applicant: MediaTek Inc., Hsin-Chu (TW)

(72) Inventors: Wen-Sung Hsu, Zhubei (TW); Ming-Chieh Lin, Jhubei (TW); Ta-Jen Yu, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/556,542

(22) Filed: Dec. 1, 2014

(65) Prior Publication Data

US 2015/0087115 A1    Mar. 26, 2015

Related U.S. Application Data

(63) Continuation of application No. 14/015,012, filed on Aug. 30, 2013.

(51) Int. Cl.
| | |
|---|---|
| *H01L 21/44* | (2006.01) |
| *H01L 21/48* | (2006.01) |
| *H01L 23/498* | (2006.01) |
| *H01L 21/56* | (2006.01) |
| H01L 23/00 | (2006.01) |
| H01L 23/31 | (2006.01) |

(52) U.S. Cl.
CPC .......... *H01L 21/4828* (2013.01); *H01L 21/481* (2013.01); *H01L 21/565* (2013.01); *H01L 23/49811* (2013.01); *H01L 23/49861* (2013.01); *H01L 24/11* (2013.01); H01L 23/3114 (2013.01); H01L 23/49827 (2013.01); H01L 24/16 (2013.01); H01L 24/81 (2013.01); H01L 2224/11912 (2013.01); H01L 2224/16238 (2013.01); H01L 2224/814 (2013.01); H01L 2224/8146 (2013.01); H01L 2224/81411 (2013.01); H01L 2224/81416 (2013.01); H01L 2224/81424 (2013.01); H01L 2224/81447 (2013.01); H01L 2224/81455 (2013.01); H01L 2924/181 (2013.01)

(58) Field of Classification Search
CPC . H01L 21/4828; H01L 21/481; H01L 21/565; H01L 24/11; H01L 24/81; H01L 23/49811; H01L 2224/11912
USPC ......... 438/611, 612, 613, 618, 666, 109, 123, 438/124, 126
See application file for complete search history.

(56) References Cited

U.S. PATENT DOCUMENTS

| | | | |
|---|---|---|---|
| 7,221,048 B2 | 5/2007 | Daeche et al. | |
| 7,875,988 B2 * | 1/2011 | Shoji et al. | 257/798 |
| 8,076,184 B1 * | 12/2011 | Camacho et al. | 438/123 |
| 8,241,956 B2 | 8/2012 | Camacho et al. | |
| 2009/0034225 A1 | 2/2009 | Shoji et al. | |

* cited by examiner

*Primary Examiner* — Hung Vu
(74) *Attorney, Agent, or Firm* — McClure, Qualey & Rodack, LLP

(57) ABSTRACT

According to an embodiment of the present invention, a method for forming a chip package is provided. The method includes: providing a conducting plate, wherein a plurality of conducting pads are disposed on an upper surface of the conducting plate; forming a plurality of conducting bumps on a lower surface of the conducting plate; patterning the conducting plate by removing a portion of the conducting plate, wherein the patterned conducting plate has a plurality of conducting sections electrically insulated from each other, and each of the conducting bumps is electrically connected to a corresponding one of the conducting sections of the patterned conducting plate; forming an insulating support layer to partially surround the conducting bumps; and disposing a chip on the conducting pads.

9 Claims, 8 Drawing Sheets

US 9,373,526 B2

CHIP PACKAGE AND METHOD FOR FORMING THE SAME

CROSS REFERENCE TO RELATED APPLICATIONS

This application is a continuation of pending U.S. application Ser. No. 14/015,012, filed on Aug. 30, 2013, the contents of which are hereby incorporated by reference.

BACKGROUND OF THE INVENTION

1. Field of the Invention

The invention relates to a chip package and methods for forming the same, and in particular, relates to a chip scale package (CSP) and methods for forming the same.

2. Description of the Related Art

A chip package not only provides protection for chips from environmental contaminants, but also provides a connection interface for chips packaged therein. As the demand for faster and smaller electronic products increase, a chip package having high-speed performance is desired. It is also desired to reduce the fabrication cost and fabrication time of the chip package.

BRIEF SUMMARY OF THE INVENTION

According to an embodiment of the present invention, a chip package is provided. The chip package includes: a patterned conducting plate having a plurality of conducting sections electrically separated from each other; a plurality of conducting pads disposed on an upper surface of the patterned conducting plate; a chip disposed on the conducting pads; a plurality of conducting bumps disposed on a lower surface of the patterned conducting plate, wherein each of the conducting bumps is electrically connected to a corresponding one of the conducting sections of the patterned conducting plate; and an insulating support layer partially surrounding the conducting bumps.

According to an embodiment of the present invention, a method for forming a chip package is provided. The method includes: providing a conducting plate, wherein a plurality of conducting pads are disposed on an upper surface of the conducting plate; forming a plurality of conducting bumps on a lower surface of the conducting plate; patterning the conducting plate by removing a portion of the conducting plate, wherein the patterned conducting plate has a plurality of conducting sections electrically insulated from each other, and each of the conducting bumps is electrically connected to a corresponding one of the conducting sections of the patterned conducting plate; forming an insulating support layer to partially surround the conducting bumps; and disposing a chip on the conducting pads.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1A:
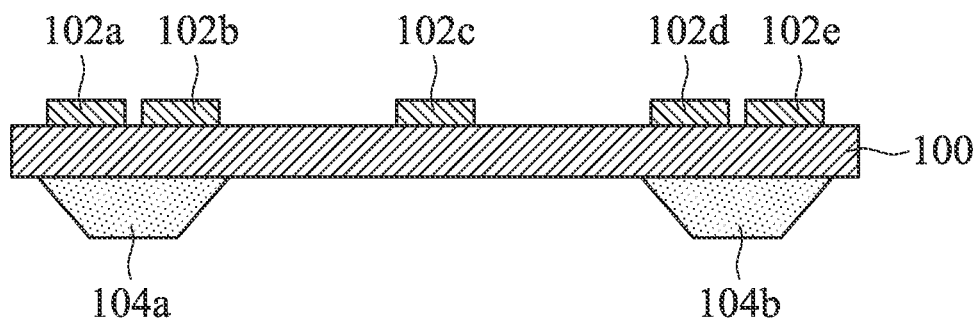
FIGS. 1A-1E are cross-sectional views showing the steps of forming a chip package according to an embodiment of the present invention.

FIGS. 1A-1E are cross-sectional views showing the steps of forming a chip package according to an embodiment of the present invention. As shown in FIG. 1A, a conducting plate 100 is provided, which may be (but is not limited to) a single layer substrate. The conducting plate 100 may include (but is not limited to) a metal material such as copper, aluminum, nickel, iron, lead, tin, or combinations thereof. Alternatively, the conducting plate 100 may include a semiconductor material with or without dopants therein. A plurality of conducting pads such as conducting pads 102a, 102b, 102c, 102d, and 102e may be disposed on an upper surface of the conducting plate 100. In one embodiment, a conducting layer may be formed on the upper surface of the conducting plate 100 and then be patterned to form the conducting pads (102a-102e). The conducting pads (102a-102e) may directly contact with the conducting plate 100. Alternatively, another material layer (not shown) may be disposed between the conducting pads and the conducting plate 100. In one embodiment, the materials of the conducting pads (102a-102e) and the conducting plate 100 are the same. In another embodiment, the material of the conducting pads (102a-102e) is different from that of the conducting plate 100. In one embodiment, a low-cost lead frame which is used in a CSP package process is modified and used as the conducting plate 100 carrying the conducting pads (102a-102e). Thus, fabrication cost of the chip package according to the embodiments of the invention is significantly reduced.

As shown in FIG. 1A, a plurality of conducting bumps such as conducting bumps 104a and 104b may be formed on a lower surface of the conducting plate 100. The conducting bumps (104a-104b) may be used as an etching mask during an optional etching process which may be subsequently performed to pattern the conducting plate 100. Thus, the pattern of the conducting bumps may be varied according to requirements. In one embodiment, an etchant having a relatively high etching speed to the conducting plate 100 (compared with the etching speed to the conducting bumps) may be used in the etching process. The etching speed can be modified by using different etchants. The etching speed can be adjusted depending on requirements. In another embodiment, each of the conducting bumps (104a-104b) may be thicker than the conducting plate 100. Thus, after the exposed portion of the conducting plate 100 is etched, the conducting bumps (104a-104b) still remain. The sizes, shapes, and/or distributions of the conducting bumps may be adjusted according to the desired pattern of the conducting plate 100. For example, each of the conducting bumps may cover at least one of the conducting pads.

Figure 1B:
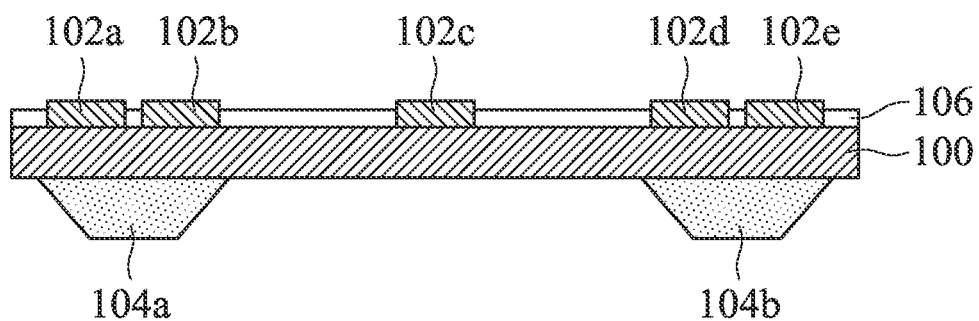

As shown in FIG. 1B, an insulating protection layer 106 may be optionally formed on the upper surface of the conducting plate 100 to surround the conducting pads (102a-102e). The conducting pads (102a-102e) are partially exposed. The insulating protection layer 106 may serve as an etch stop layer during a following etching process and hold the conducting pads (102a-102e) on the conducting plate 100. The material of the insulating protection layer 106 may include (but is not limited to) a non-conductive film or paste. The non-conductive film or paste may include oxide, nitride, polymer, or combinations thereof.

Figure 1C:
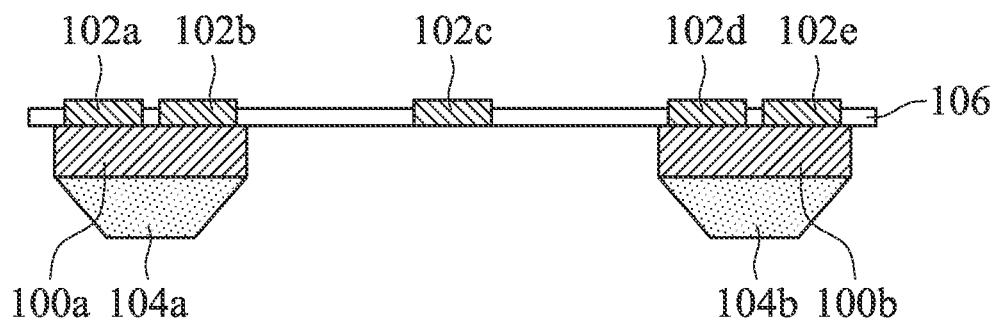

Referring to FIG. 1C, the conducting plate 100 is then patterned by removing a portion of the conducting plate 100. In one embodiment, the conducting bumps 104a and 104b may be used as an etching mask, and an etching process may be performed on the lower surface of the conducting plate 100 to partially remove the conducting plate 100. The portion of the conducting plate 100 not covered by the conducting bumps such as the conducting bumps 104a and 104b may be removed to form openings in the conducting plate 100. As shown in FIG. 1C, the patterned conducting plate has a plurality of conducting sections such as conducting sections 100a and 100b. However, it should be appreciated that embodiments of the invention are not limited thereto. In another embodiment, an additional mask layer such as a patterned photoresist layer (not shown) may be formed on the lower surface of the conducting plate 100. The mask layer has openings exposing a portion of the conducting plate 100. A following etching process may be performed to partially remove the conducting plate 100 through the openings of the mask layer such that the conducting plate 100 is patterned according to requirements.

The conducting sections 100a and 100b may be electrically insulated from each other. Each of the conducting bumps is electrically connected to a corresponding one of the conducting sections of the patterned conducting plate. For example, the conducting bump 104a may be electrically connected to the conducting section 100a, and the conducting bump 104b may be electrically connected to the conducting section 100b. In one embodiment, the conducting pads 102a and 102b may be electrically connected to the conducting bump 104a through the conducting route provided by the conducting section 100a. Similarly, the conducting pad 102c may be electrically connected to a conducting bump (not shown) through the conducting route provided by another conducting section (not shown) of the patterned conducting plate. The conducting pad 102c may extend along a direction perpendicular to the cross-sectional view shown in FIG. 1D to electrically contact with a corresponding conducting section (not shown) of the patterned conducting plate. Alternatively, the conducting pad 102c may be a dummy pad without electrically connecting to any conducting bump.

Figure 1D:
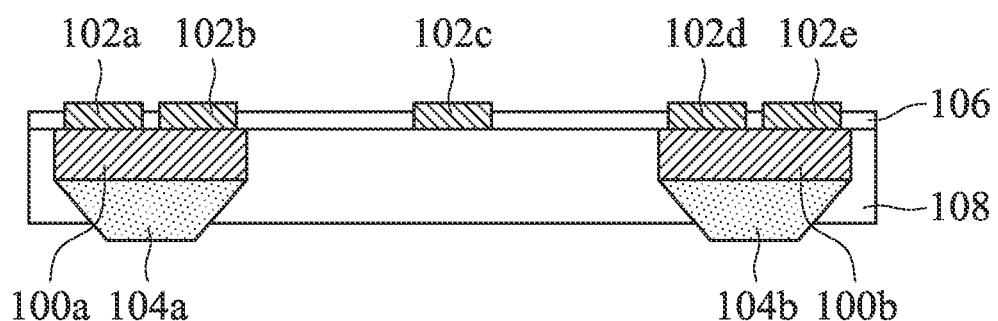

Referring to FIG. 1D, an insulating support layer 108 may then be formed to partially surround the conducting bumps 104a and 104b. In this embodiment, the insulating support layer 108 may further extend into openings between the conducting sections of the patterned conducting plate (such as the opening between the conducting sections 100a and 100b) to surround sidewalls of the conducting sections. In one embodiment, the insulating support layer 108 may directly contact with at least one of the conducting pads such as the conducting pad 102c through at least one opening between the conducting sections of the patterned conducting plate. The insulating support layer 108 fixes the conducting sections and the conducting pads and conducting bumps thereon and provides for better structural strength. The material of the insulating support layer 108 may include (but is not limited to) a non-conductive film or paste. The non-conductive film or paste may include oxide, nitride, polymer, or combinations thereof.

Figure 1E:
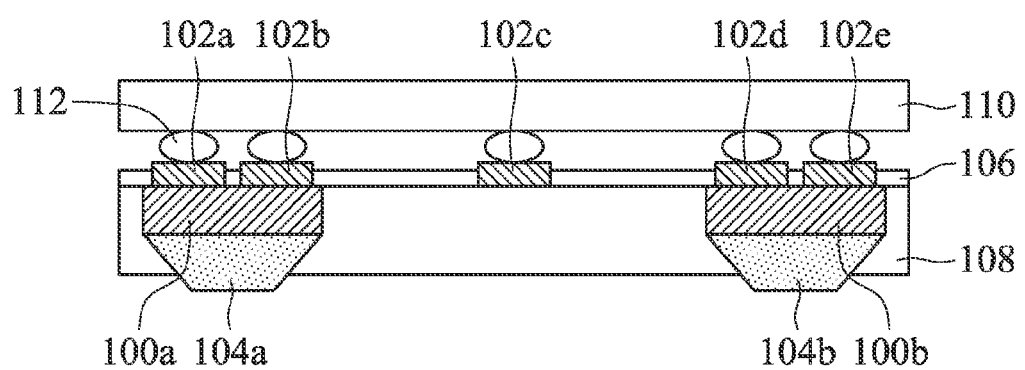

As shown in FIG. 1E, a chip 110 may be disposed on the conducting pads by using, for example, a flip-chip process. In one embodiment, a plurality of conducting structures 112 may be optionally disposed between the chip 110 and the conducting pads (102a-102e). The structure shown in FIG. 1E may be optionally disposed on a printed circuit board (not shown). Solder balls may be formed between the printed circuit board and the conducting bumps. Thus, electrical signals may be transmitted between the printed circuit board and the chip 110 through the conducting sections of the patterned conducting plate and the conducting pads and conducting bumps thereon. In this embodiment, the chip 110 electrically communicates with another electronic component directly through the patterned conducting plate without any bonding wire. Electrical signals may be transmitted at a faster speed.

Figure 5:
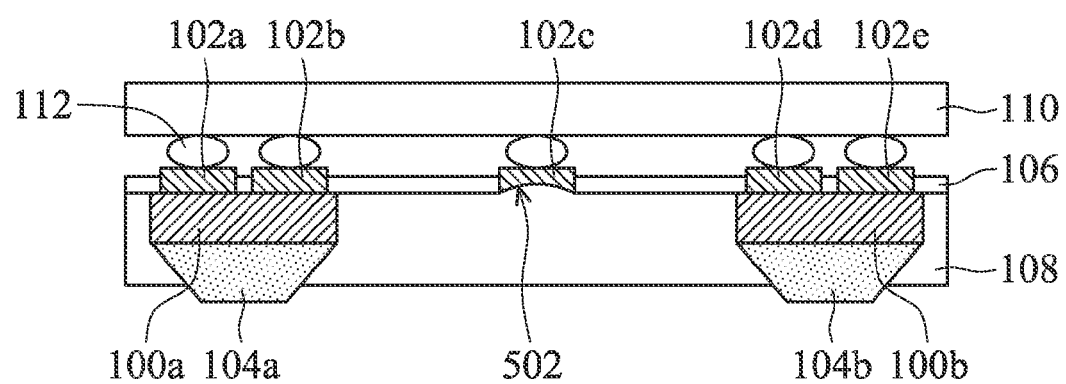
FIG. 5 is a cross-sectional view showing a chip package according to an embodiment of the present invention.

Embodiments of the invention may have many variations. For example, FIG. 5 is a cross-sectional view showing a chip package according to an embodiment of the present invention, wherein same or similar reference numbers are used to designate same or similar elements. In one embodiment, after the etching process mentioned in FIG. 1C is performed, a recess 502 may be formed from a surface of the one of the conducting pads such as the conducting pad 102c. The recess 502 may extend from a lower surface towards an inner portion of the conducting pad 102c.

Figure 2A:
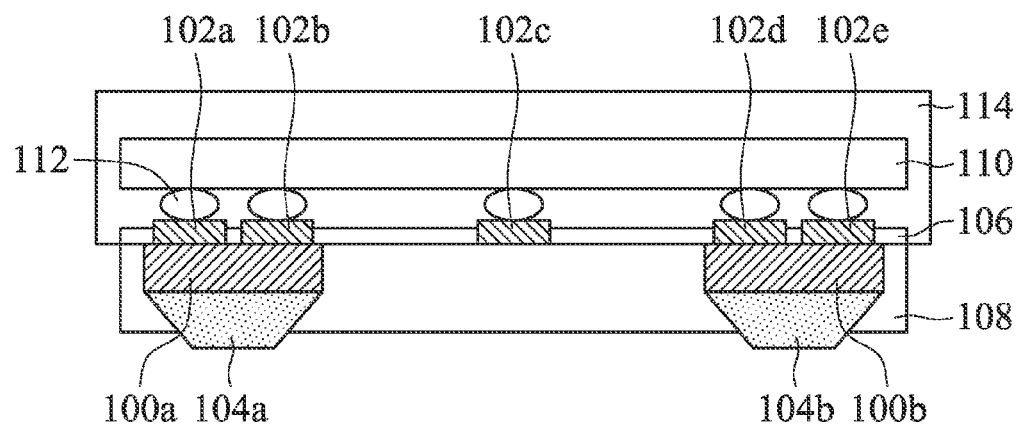
FIGS. 2A and 2B are cross-sectional views showing chip packages according to the embodiments of the present invention.
Figure 2B:
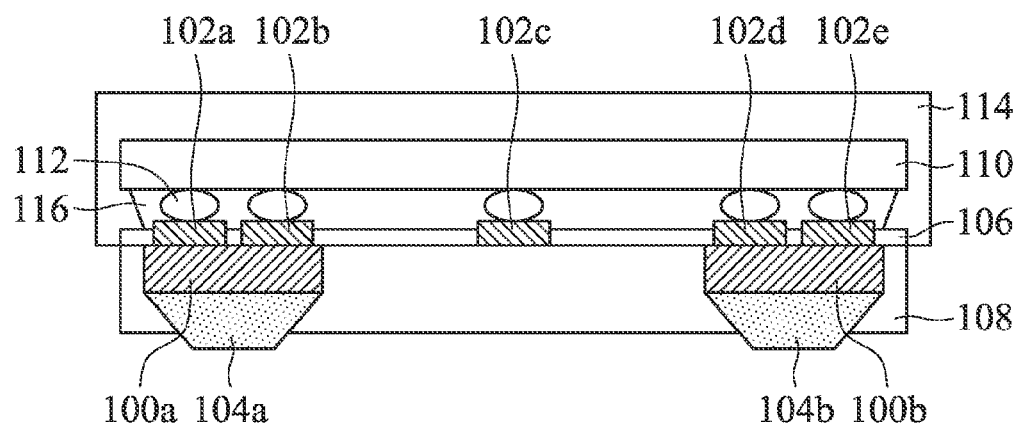

FIGS. 2A and 2B are cross-sectional views showing chip packages according to the embodiments of the present invention, wherein same or similar reference numbers are used to designate same or similar elements. As shown in FIG. 2A, in one embodiment, a molding compound 114 such as a molded underfill may be optionally formed on the patterned conducting plate to cover the chip 110. The molding compound 114 may cover the conducting structures 112 and the conducting pads. As shown in FIG. 2B, in another embodiment, an underfill 116 such as a capillary underfill may be optionally formed between the chip 110 and the conducting pads. The underfill 116 may surround the conducting structures 112.

Figure 3A:
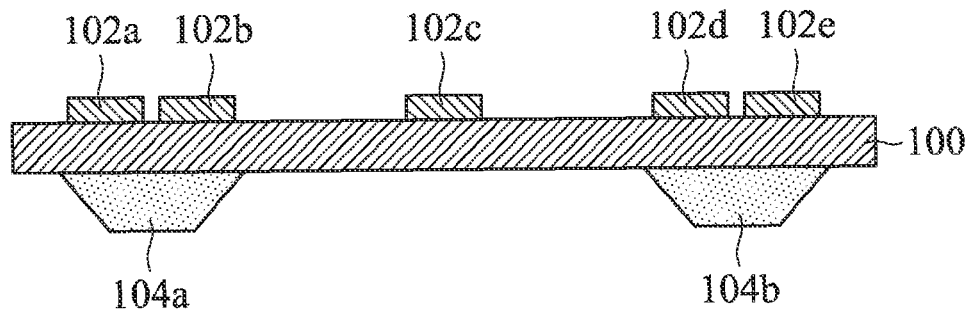
FIGS. 3A-3D are cross-sectional views showing the steps of forming a chip package according to an embodiment of the present invention.

FIGS. 3A-3D are cross-sectional views showing the steps of forming a chip package according to another embodiment of the present invention, wherein same or similar reference numbers are used to designate same or similar elements. As shown in FIG. 3A, a structure similar to the structure shown in FIG. 1A is provided.

Figure 3B:
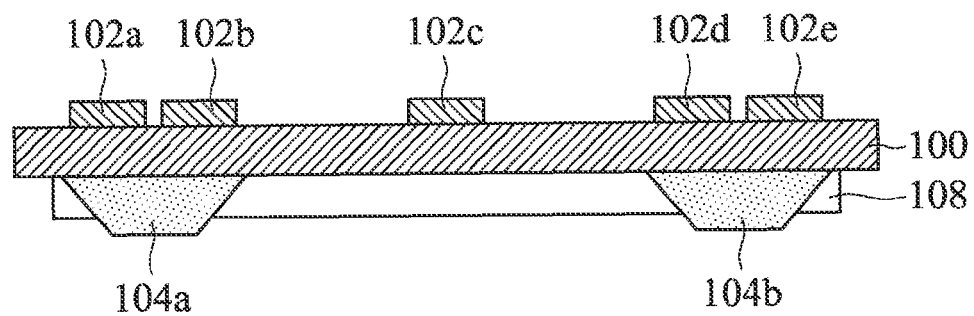
Figure 3C:
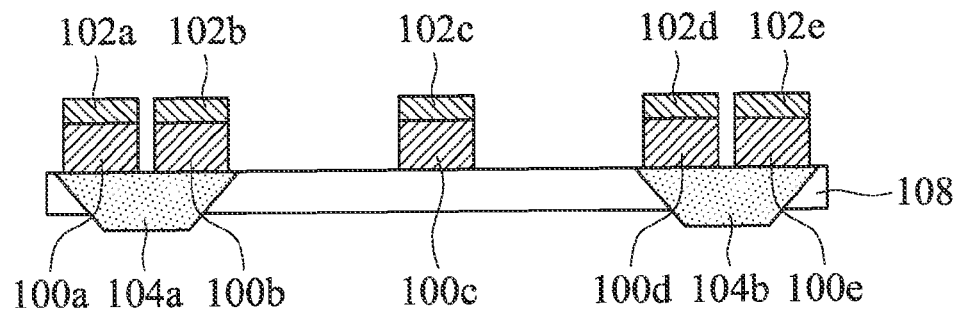

Referring to FIG. 3B, an insulating support layer 108 is formed on the lower surface of the conducting plate 100 which has not yet been patterned. Then, as shown in FIG. 3C, the conducting plate 100 is patterned to form a patterned conducting plate which has a plurality of conducting sections such as conducting sections 100a, 100b, 100c, 100d, and 100e electrically insulated from each other. In one embodiment, an etching process may be performed on the upper surface of the conducting plate 100 to partially remove the conducting plate 100. In one embodiment, the conducting pads (102a-102e) may be used as an etching mask during the etching process. An etchant which has a relative low etching speed to the conducting pads (102a-102e) may be used in the etching process. Alternatively, a mask layer (not shown) such as a patterned photoresist layer may be formed on the upper surface of the conducting plate 100. Then, an etching process may be performed on the portion of the conducting plate 100 not covered by the mask layer to pattern the conducting plate 100 into the conducting sections (100a-100e).

Figure 3D:
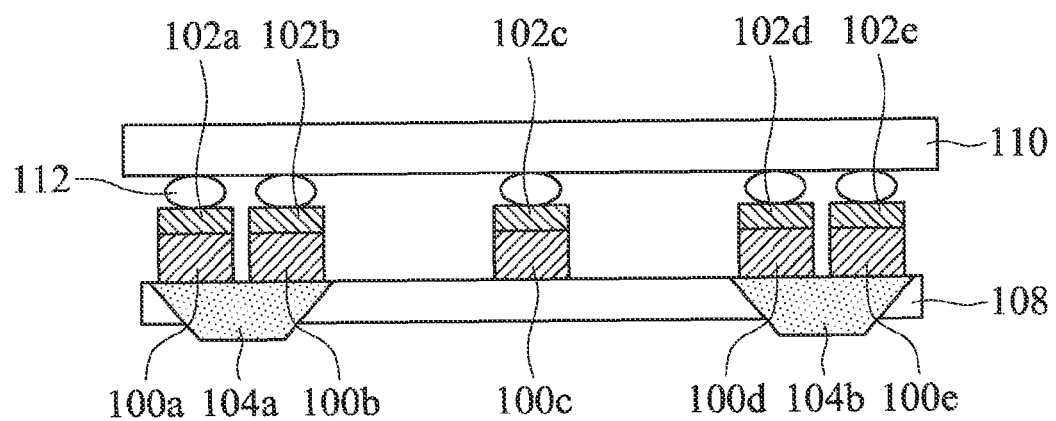

As shown in FIG. 3D, a chip 110 may be disposed on the conducting pads, and conducting structures 112 may be formed therebetween for electrical connections. A flip-chip process may be applied to dispose the chip 110. Thus, electrical signals may be transmitted between the chip 110 and an electronic component (not shown) disposed under the conducting bumps through the patterned conducting plate. In this embodiment, the insulating support layer 108 does not directly contact with the conducting pads (102a-102e). In addition, the insulating support layer 108 does not surround the conducting sections (100a-100e) of the patterned conducting plate.

Figure 4A:
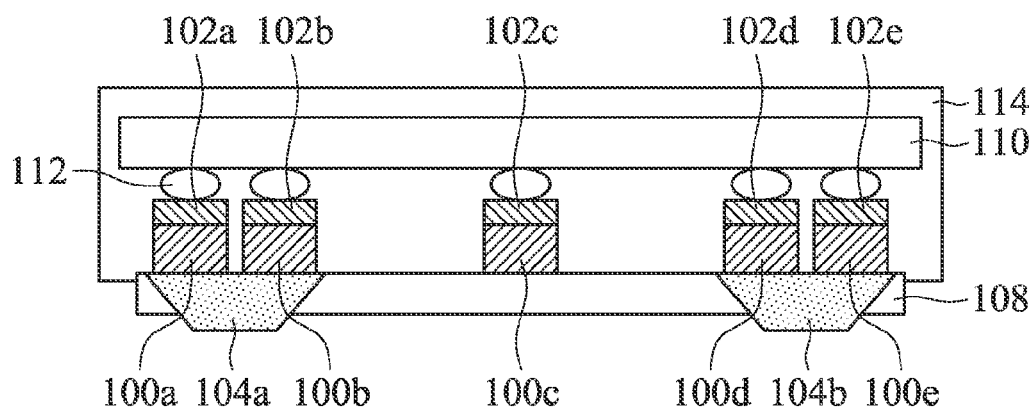
FIGS. 4A and 4B are cross-sectional views showing chip packages according to the embodiments of the present invention.
Figure 4B:
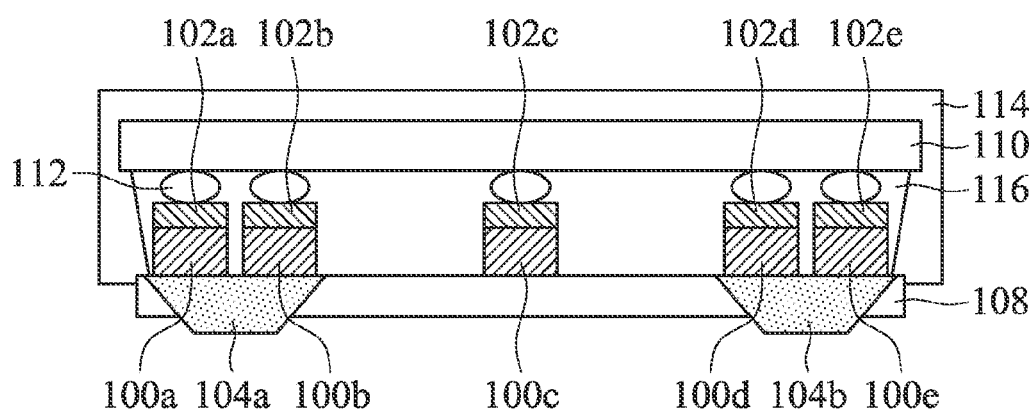

FIGS. 4A and 4B are cross-sectional views showing chip packages according to the embodiments of the present invention, wherein same or similar reference numbers are used to designate same or similar elements. As shown in FIG. 4A, in one embodiment, a molding compound 114 may be optionally formed on the patterned conducting plate to cover the chip 110. The molding compound 114 may cover the conducting structures 112 and the conducting pads. As shown in FIG. 4B, in another embodiment, an underfill 116 may be optionally formed between the chip 110 and the conducting pads. The underfill 116 may surround the conducting structures 112.

In the embodiments of the invention, the fabrication cost of the chip package may be significantly reduced. In addition, a chip package having a reduced size and a better performance is achieved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
   providing a conducting plate, wherein a plurality of conducting pads are disposed on an upper surface of the conducting plate;
   forming one or more conducting bumps on a lower surface of the conducting plate and below at least one of the conducting pads, and the conducting bumps are not formed below each one of the conducting pads;
   patterning the conducting plate by removing a portion of the conducting plate, wherein the patterned conducting plate has a plurality of conducting sections electrically insulate from each other, and each of the conducting bumps is electrically connected to a corresponding one of the conducting sections of the patterned conducting plate;
   forming an insulating support layer to partially surround the conducting bumps; and
   disposing a chip on the conducting pads;
   wherein the step of patterning the conducting plate comprises performing an etching process on the lower surface of the conducting plate to remove the portion of the conducting plate, and the conducting bumps serve as a etching mask during the etching process.

2. The method of forming a chip package as claimed in claim 1, wherein the insulating support layer is formed after the conducting plate is patterned, and the insulating support layer further surrounds sidewalls of the conducting sections of the patterned conducting plate.

3. The method of forming a chip package as claimed in claim 2, further comprising an insulating protection layer disposed on the upper surface of the conducting plate to surround the conducting pads before the conducting plate is patterned.

4. The method of forming a chip package as claimed in claim 1, wherein a recess is formed from a surface of one of the conducting pads after the etching process is performed.

5. The method of forming a chip package as claimed in claim 1, further comprising forming a molding compound on the patterned conducting plate to cover the chip.

6. A method for forming a chip package, comprising:
   providing a conducting plate;
   forming one or more conducting pads on an upper surface of the conducting plate;
   forming one or more conducting bumps on a lower surface of the conducting plate and below at least one of the conducting pads, and the conducting bumps are not formed below each one of the conducting pads;
   forming an insulating support layer on the lower surface of the conducting plate to partially surround the conducting bumps;
   patterning the conducting plate by removing a portion of the conducting plate, wherein the patterned conducting plate has a plurality of conducting sections electrically insulated from each other, and each of the conducting bumps is electrically connected to a corresponding one of the conducting sections of the patterned conducting plate; and
   disposing a chip on the conducting pads;
   wherein the insulating support layer is formed before the conducting plate is patterned.

7. The method for forming a chip package as claimed in claim 6, wherein the step of patterning the conducting plate comprises performing an etching process on the upper surface of the conducting plate to remove the portion of the conducting plate.

8. The method for forming a chip package as claimed in claim 7, wherein the conducting pads serve as an etching mask during the etching process.

9. The method for forming a chip package as claimed in claim 6, further comprising forming a molding compound on the patterned conducting plate to cover the chip.

* * * * *